United States Patent

[11] 3,555,168

[72] Inventor William C. Frykberg
Rochester, N.Y.
[21] Appl. No. 832,266
[22] Filed June 11, 1969
[45] Patented Jan. 12, 1971
[73] Assignee Tapecon Inc.
Rochester, N.Y.
a corporation of New York

[54] SHIELDING GASKET
3 Claims, No Drawings

[52] U.S. Cl. .......... 174/35, 277/235
[51] Int. Cl. .......... H05k 9/00
[50] Field of Search .......... 174/35.2, 35.4; 277/235, 236, 227

[56] References Cited
UNITED STATES PATENTS

| | | | |
|---|---|---|---|
| 3,260,788 | 7/1966 | Stetson | 174/35(.2) |
| 3,446,906 | 5/1969 | Zulauf | 174/35(.2) |

*Primary Examiner*—Darrell L. Clay
*Attorney*—Cumpston, Shaw & Stephens

ABSTRACT: An RF shielding gasket is formed as a conductive foil lamina bonded to a compressively resilient foam backing by a flexible adhesive and mounted on a cover by pressure-sensitive adhesive coating on the back of the foam lamina so when the cover is closed over a cabinet containing electronic equipment, the foil is held in intimate contact with the cabinet by the resilient foam lamina.

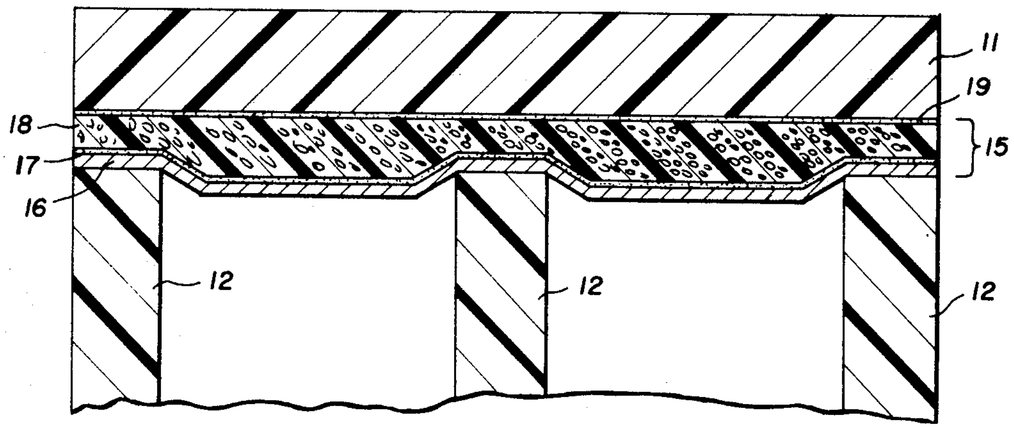

PATENTED JAN 1 2 1971 3,555,168

INVENTOR.
WILLIAM C. FRYKBERG
BY Cumpston, Shaw & Stephens
ATTORNEYS

SHIELDING GASKET

THE NEED FOR IMPROVEMENT

Much electronic equipment requires shielding gaskets to prevent the passage of unwanted radiation to or from the equipment. Such equipment is often subjected to wide ranges of temperature and humidity variation, and substantial vibration and shock, and at the same time, shielding gaskets must be tight to provide unbroken, conductive shielding contact around the equipment. Providing a successful shielding package for electronic equipment has thus posed substantial engineering problems, and many proposals have been made to meet these needs. The previously practical proposals have suffered many disadvantages including high expense of materials and installation, deterioration with age, and unreliability.

The objects of this invention include, without limitation, overcoming the drawbacks of prior art shielding gasket that is easy to install, reliable, effective, compatible with equipment requirements, and not only RF-tight but dusttight.

THE INVENTION SOLUTION

These objects are accomplished according to the invention by a laminate of foil and foam having special characteristics allowing its mounting on the cover of a cabinet containing electronic equipment so that when the cover is closed the foil is pressed into intimate contact with the cabinet by a resilient foam backing material. The foil has a conductive face surface and is bonded to a compressibly resilient foam material by a flexible adhesive; a pressure-sensitive adhesive coating covers the back surface of the foam and bonds the laminate to the inside of the cabinet cover. When the cover is closed the foil engages the cabinet which presses against the foil to compress the foam, and when the cover is opened the foam resiliently springs back to normal shape. This allows comfortable manufacturing tolerances between the cabinet and the cover and insures an intimate, conductive contact between the shielding foil and the cabinet. It makes the cabinet cover dusttight as well as RF-tight.

SUMMARY OF THE INVENTION

The inventive shielding gasket is used in an electronic equipment cabinet and cover with a foil laminate bonded to its inside surface to engage the cabinet when the cover is closed. The laminate includes a foil of conductive material from 0.001 to 0.010 inches thick with a face surface that is electrically conductive, a flexible adhesive covering the back surface of the foil and bonding the foil to a compressible resilient lamina of foamed resin or rubber 0.015 to 0.500 inches thick, and a pressure-sensitive adhesive coating covering the back surface of the foam lamina to bond the laminate to the inside of the cover.

DRAWINGS

DETAILED DESCRIPTION

Figure 1:
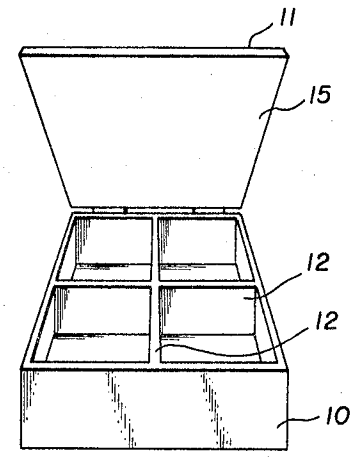
FIG. 1 is a perspective view of an electronic equipment cabinet having a sealing gasket according to the invention.
Figure 2:
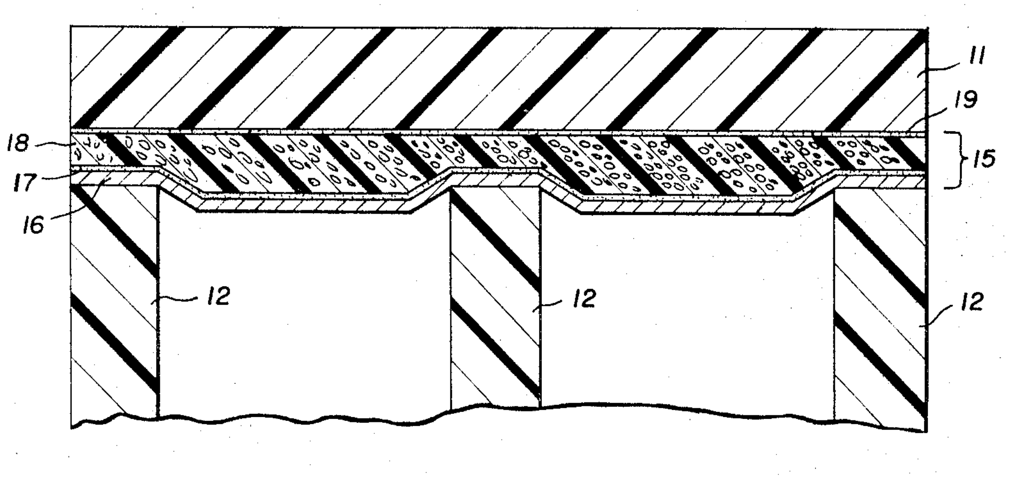
FIG. 2 is a partially schematic, cross-sectional view of the inventive sealing gasket in sealing position.

The drawings illustrate a preferred embodiment of the invention. For convenience of illustration, the thickness of laminae in FIG. 2 is exaggerated.

Cabinet 10 is made to house electronic equipment (not shown) such as a radio transmitter or receiver. Cover 11 is arranged to close the access opening to cabinet 10 and can move in any known way. Partitions 12 divide cabinet 10 into compartments holding electronic equipment. The inventive sealing gasket 15 is arranged on the inside of cover 10 to engage the outer walls and the partitions 12 of cabinet 10 as cover 11 is closed. The construction of shielding 15 is best shown in FIG. 2 where cover 11 is illustrated as closed down over partitions 12.

Gasket laminate 15 includes a foil lamina 16 on its outer face. Foil 16 is formed of an electrically conducting material such as copper, aluminum, brass, monel, stainless steel, nickel, etc., and the face surface of foil lamina 16 engaging partitions 12 is electrically conductive. Foil 16 if preferably from 0.001 to 0.010 inches thick. To eliminate oxidation and to provide continuous grounding without degradation of electrical contact between foil 16 and partitions 12, the face surface of foil 16 if preferably plated with a conducting material such as cadmium, silver, gold, etc.

The back surface of foil 16 is covered with a flexible adhesive 17 that can bend and flex without reduction of adhesive capacity. Adhesive 17 bonds foil 16 to a foam lamina 18.

Foam lamina 18 is compressibly resilient so that it can be dented in as illustrated above partitions 12 to a fraction of its normal thickness and resiliently spring back toward its normal flat shape after such deformation. Many foamed resin or rubber materials are compressibly resilient and suitable for lamina 18, including rubber neoprene, vinyl, polyurethane, silicone, rubber, etc. Preferably, lamina 16 is manufactured as a closed cell, medium density neoprene foam from 0.015 to 0.500 inches thick.

A pressure-sensitive adhesive 19 covers the back of foam lamina 18 and bonds the laminate 15 to the inside of cover 11. Preferably the pressure-sensitive adhesive coating 19 on the back of laminate 15 is covered by a peeloff paper which is removed before laminate 15 is secured in place on cover 11.

Laminate 15 can be die cut to any desired shape and is pressed in place on cover 11 to engage the desired surfaces of cabinet 10 for shielding contact. The compressive resilience of foam lamina 16 gives a springy bias to shielding foil 16 and eliminates the need for close manufacturing tolerances. As cover 11 is placed in closed position over cabinet 10, foil 16 is held in intimate electrical contact with partitions 12 and other desired surfaces of cabinet 10 under the bias of lamina 18 which is compressed in the region of such intimate contact.

Thus, the invention accomplishes its objects in providing an RF-tight, dusttight, effective and reliable shielding gasket that is extremely simple, easy to apply, and very economical. It fills a longstanding need by a simple construction previously overlooked.

Persons wishing to practice the invention should remember that other embodiments and variations can be adapted to particular circumstances. Even though one point of view is necessarily chosen in describing and claiming the invention, this should not inhibit broader or related applications within the spirit of the invention. For example, the inventive shielding gasket can be applied to a wide variety of cabinet and cover shapes, and many materials for the conductive foil, the adhesives, and the compressibly resilient lamina can be used within the spirit of the invention.

I claim:

1. A shielding gasket comprising:
   a. a cabinet containing electronic equipment;
   b. a movable cover closing said cabinet;
   c. a foil lamina of electrically conductive material;
   d. said foil lamina being from 0.001 to 0.010 inches thick;
   e. the face surface of said lamina being electrically conductive;
   f. an adhesive coating covering the back surface of said foil lamina;
   g. said adhesive coating being flexible without reduction in adhesive strength;
   h. a lamina of foam resin material bonded to said back surface of said foil lamina by said flexible adhesive;
   i. said foam lamina being compressibly resilient;
   j. said foam lamina being from 0.015 to 0.500 inches thick;
   k. a pressure-sensitive adhesive coating covering the back surface of said foam lamina; and
   l. said foil and foam laminate being bonded to said cover by said pressure-sensitive adhesive coating with said face surface of said foil in intimate contact with said cabinet and said foam lamina compressed in the region of said intimate contact.

2. The shielding gasket of claim 1 including a conductive plating on said face surface on said foil.

3. The shielding gasket of claim 1 including. partitions in said cabinet and wherein said foil is in said intimate contact with said partitions.